(12) United States Patent
Lim et al.

(10) Patent No.: US 9,729,142 B2
(45) Date of Patent: Aug. 8, 2017

(54) COIL DRIVER IC HAVING A CIRCUIT CAPABLE OF PLACING A COIL CONNECTED OUTPUT TERMINAL INTO A FLOATING STATE

(71) Applicant: ZINITIX CO., LTD., Gyeonggi-do (KR)

(72) Inventors: Ji Soo Lim, Gyeonggi-do (KR); Dae Yeul Tcho, Gyeonggi-do (KR); Jin Woo Lee, Gyeonggi-do (KR); Young Hee Lee, Gyeonggi-do (KR)

(73) Assignee: ZINITIX CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/137,059

(22) Filed: Apr. 25, 2016

(65) Prior Publication Data

US 2016/0315610 A1    Oct. 27, 2016

(30) Foreign Application Priority Data

Apr. 24, 2015    (KR) .................. 10-2015-0058203

(51) Int. Cl.
*H03K 17/687* (2006.01)
*H03K 19/082* (2006.01)

(52) U.S. Cl.
CPC ....... *H03K 17/687* (2013.01); *H03K 19/0826* (2013.01)

(58) Field of Classification Search
CPC .................. H03K 17/687; H03K 17/6875

USPC .............................. 326/82, 83; 327/108, 110
See application file for complete search history.

(56) References Cited

U.S. PATENT DOCUMENTS

| 5,835,331 A | * | 11/1998 | Shuey ..................... H02J 13/00 |
| | | | 307/116 |
| 2002/0017930 A1 | * | 2/2002 | Kominami .......... H04L 25/0266 |
| | | | 327/110 |

FOREIGN PATENT DOCUMENTS

| JP | 2004-135487 | 4/2004 |
| KR | 10-2014-0138138 A | 12/2014 |
| WO | 2013/057896 A1 | 4/2013 |

* cited by examiner

*Primary Examiner* — William Hernandez
(74) *Attorney, Agent, or Firm* — Mayer & Williams, PC; Stuart H. Mayer

(57) ABSTRACT

A coil-driving IC having a first output terminal configured connected to a first terminal of a coil and a second output terminal configured connected to a second terminal of the coil is disclosed. The coil-driving IC comprises a first switch connected to the first output terminal; a second switch connected to the second output terminal; a current driving part comprising a first current terminal connected to the first output terminal via the first switch and a second current terminal connected to the second output terminal via the second switch; and a gate driving part controlling the first switch and the second switch so that, when the coil is driven by a current provided from the first current terminal or the second current terminal, the first switch and the second switch are in an ON state, otherwise, the first switch and the second switch are in an OFF state.

10 Claims, 5 Drawing Sheets

FIG. 5

| I1 | Voltage levels of output terminals of gate driving part | | | | | |
|---|---|---|---|---|---|---|
| | GS1 | GH1 | GL1 | GS2 | GH2 | GL2 |
| | 2VCC | 2VCC | 0V | VCC | 0V | VCC |
| | ON/OFF state of the transistors | | | | | |
| | SW1 | TH1 | TL1 | SW2 | TH2 | TL2 |
| | ON | ON | OFF | ON | OFF | ON |

(a)

| I2 | Voltage levels of output terminals of gate driving part | | | | | |
|---|---|---|---|---|---|---|
| | GS1 | GH1 | GL1 | GS2 | GH2 | GL2 |
| | VCC | 0V | VCC | 2VCC | 2VCC | 0V |
| | ON/OFF state of the transistors | | | | | |
| | SW1 | TH1 | TL1 | SW2 | TH2 | TL2 |
| | ON | OFF | ON | ON | ON | OFF |

(b)

COIL DRIVER IC HAVING A CIRCUIT CAPABLE OF PLACING A COIL CONNECTED OUTPUT TERMINAL INTO A FLOATING STATE

CROSS-REFERENCE TO RELATED APPLICATION

This application claims priority to Korean Patent Application No. 10-2015-0058203 filed on Apr. 24, 2015, and all the benefits accruing therefrom under 35 U.S.C. §119, the contents of which are incorporated by reference in their entirety.

BACKGROUND

The present invention relates to a coil-driving IC, specifically to a coil-driving IC which is capable of breaking off the connection between an output terminal of the coil-driving IC and a coil by changing the state of the output terminal of the coil-driving IC into a floating state, when the coil is commonly connected to output terminals of a plurality of coil-driving ICs.

A coil can be utilized at a user device for transferring data and/or electric power through a wireless channel. Such a user device may comprise a plurality of coils and a plurality of coil-driving ICs connected to the plurality of coils in order to support various applications installed in the user device. However, a single coil can be shared by all of the plurality coil-driving ICs for use in timely divided manner, by connecting the single coil commonly to the plurality of coil-driving ICs.

For example, in a certain electric device, a first coil-driving IC supporting a function for MST (Magnetic Stripe Transmission) and a second coil-driving IC supporting a function for NFC (Near Field Communication) can be connected commonly to a single coil so that the single coil is utilized by the first coil-driving IC and the second coil-driving IC in a timely divided manner. Such an electric device can be referred to as a 'coil-sharing electric device' in this specification. For the coil-sharing electric device, when the coil-sharing electric device is in a first mode that the first coil-driving IC exclusively controls the operation of the single coil, desired circuit performance can be achieved only by breaking off the electric connection between terminals of the second coil-driving IC and the single coil. To the contrary, when the coil-sharing electric device is in a second mode that the second coil-driving IC exclusively controls the operation of the single coil, desired circuit performance can be achieved only by breaking off the electric connection between terminals of the first coil-driving IC and the single coil.

In order to implement such functions, switches can be inserted to connect between each of the coil-driving ICs and the single coil. However, the inserted switches increase the whole price of the coil-sharing electric device.

As another technical approach, a method can be used that a switch is connected at a power source of each of the coil-driving ICs to shut off the power source when necessary. However, because a current leakage path can be formed between the single coil and the internal portion of the shut-off coil-driving IC, undesired effects may occur.

SUMMARY

One object of the present invention is to provide a coil-driving IC which is capable of breaking off a connection to a coil, which is connected to the coil-driving IC, by changing the states of the output terminals of the coil-driving IC into a floating state, where the coil is connected in common to the output terminals of a plurality of coil-driving ICs.

In accordance with one aspect of the present invention, a coil-driving IC having a first output terminal configured to be connected to a first terminal of a coil and a second output terminal configured to be connected to a second terminal of the coil is provided. The coil-driving IC comprises a first switch connected to the first output terminal; a second switch connected to the second output terminal; a current driving part comprising a first current terminal connected to the first output terminal via the first switch and a second current terminal connected to the second output terminal via the second switch; and a gate driving part controlling the first switch and the second switch so that, when the coil is driven by a current provided from the first current terminal or the second current terminal, the first switch and the second switch are in an ON state, otherwise, the first switch and the second switch are in an OFF state.

In a preferred embodiment, the current driving part may comprise a first upper transistor, a first lower transistor, a second upper transistor, and a second lower transistor; a source of the first upper transistor may be connected to a drain of the first lower transistor; a source of the second upper transistor may be connected to a drain of the second lower transistor; the first current terminal may be the source of the first upper transistor; and the second current terminal may be the source of the second upper transistor.

In a preferred embodiment, the gate driving part may be configured to control a voltage applied to a gate of the first upper transistor, a voltage applied to a gate of the first lower transistor, a voltage applied to a gate of the second upper transistor, and a voltage applied to a gate of the second lower transistor; the first switch may comprise a first DMOS, and the second switch may comprise a second DMOS; and the gate driving part may be configured to control a voltage applied to a gate of the first switch and a voltage applied to a gate of the second switch.

In a preferred embodiment, when the first switch and the second switch are controlled to be in an ON state, a voltage twice of a operation voltage of the coil-driving IC may be applied to the gate of the first switch and the gate of the first upper transistor; the operation voltage of the coil-driving IC may be applied to the gate of the second switch and the gate of the second lower transistor; and a ground voltage may be applied to the gate of the first lower transistor and the gate of the second upper transistor, or the voltage twice of a operation voltage of the coil-driving IC may be applied to the gate of the second switch and the gate of the second upper transistor; the operation voltage of the coil-driving IC may be applied to the gate of the first switch and the gate of the first lower transistor; and a ground voltage may be applied to the gate of the first upper transistor and the gate of the second lower transistor.

In a preferred embodiment, a charge pump comprised in the gate driving part may generate a voltage applied to the gate of the first upper transistor, a voltage applied to the gate of the second upper transistor, a voltage applied to the gate of the second lower transistor, a voltage applied to the gate of the first switch, and a voltage applied to the gate of the second switch.

In a preferred embodiment, the first switch may comprise a first DMOS, and the second switch may comprise a second DMOS; a source of the first switch may be connected to the first current terminal and a drain of the first switch may be connected to the first output terminal; a source of the second switch may be connected to the second current terminal and a drain of the second switch may be connected to the second output terminal; a first diode may be provided between the source and the drain of the first switch, wherein a cathode of the first diode is connected to the drain of the first switch; and a second diode may be provided between the source and the drain of the second switch, wherein a cathode of the second diode is connected to the drain of the second switch.

In a preferred embodiment, the first upper transistor may be an NMOS device and the second transistor may be an NMOS device.

In a preferred embodiment, when a current flows from a first terminal of the coil to a second terminal of the coil, a gate voltage of the first switch may be higher than both a gate voltage the second switch and a gate voltage of the second lower transistor, and a gate voltage of the first upper transistor may be higher than both a gate voltage of the second switch and a gate voltage of the second lower transistor; and a gate voltage of the second switch may be higher than both a gate voltage the first lower transistor and a gate voltage of the second upper transistor, and a gate voltage of the second lower transistor may be higher than both a gate voltage of the first lower transistor and a gate voltage of the second upper transistor.

In other preferred embodiment, when a current flows from a second terminal of the coil to a first terminal of the coil, a gate voltage of the second switch may be higher than both a gate voltage the first switch and a gate voltage of the first lower transistor, and a gate voltage of the second upper transistor may be higher than both a gate voltage of the first switch and a gate voltage of the first lower transistor; and a gate voltage of the first switch may be higher than both a gate voltage the first upper transistor and a gate voltage of the second lower transistor, and a gate voltage of the first lower transistor may be higher than both a gate voltage of the first upper transistor and a gate voltage of the second lower transistor.

In accordance with other aspect of the present invention, a coil-sharing electric device comprising a coil; a first coil-driving IC having a first output terminal connected to a first terminal of the coil and a second output terminal connected to a second terminal of the coil; and a second coil-driving IC connected to both the first terminal of the coil and the second terminal of the coil is provided.

The first coil-driving IC comprises: a first switch connected to the first output terminal; a second switch connected to the second output terminal; a current driving part comprising a first current terminal connected to the first output terminal via the first switch and a second current terminal connected to the second output terminal via the second switch; and a gate driving part controlling the first switch and the second switch so that, when the coil is driven by a current provided from the first current terminal or the second current terminal, the first switch and the second switch are in an ON state, otherwise, the first switch and the second switch are in an OFF state.

According to the present invention, a coil driving-IC can be provided which can break off the connection between a coil and the output terminals of the coil-driving IC by changing the state of the output terminals into a floating state, where the coil is commonly connected to output terminals of a plurality of coil-driving ICs.

BRIEF DESCRIPTION OF THE DRAWINGS

Exemplary embodiments can be understood in more detail from the following description taken in conjunction with the accompanying drawings, in which:

FIG. 5 represents a table indicating the voltage levels of the output terminals of the gate driving part and ON/OFF state of the transistors of the first coil-driving IC, for the coil-sharing electric device according to the other embodiment of the present invention shown in FIG. 4.

DETAILED DESCRIPTION OF EMBODIMENTS

In the following, embodiments of the present disclosure are described with reference to the accompanying drawings. However, the present disclosure is not limited to the embodiments described in the specification and may be implemented in other forms. The terms used herein are to help the understanding of the embodiments and are not intended to define the scope of the present disclosure. Also, singular forms used below also include plural forms unless stated to the contrary.

Figure 1:
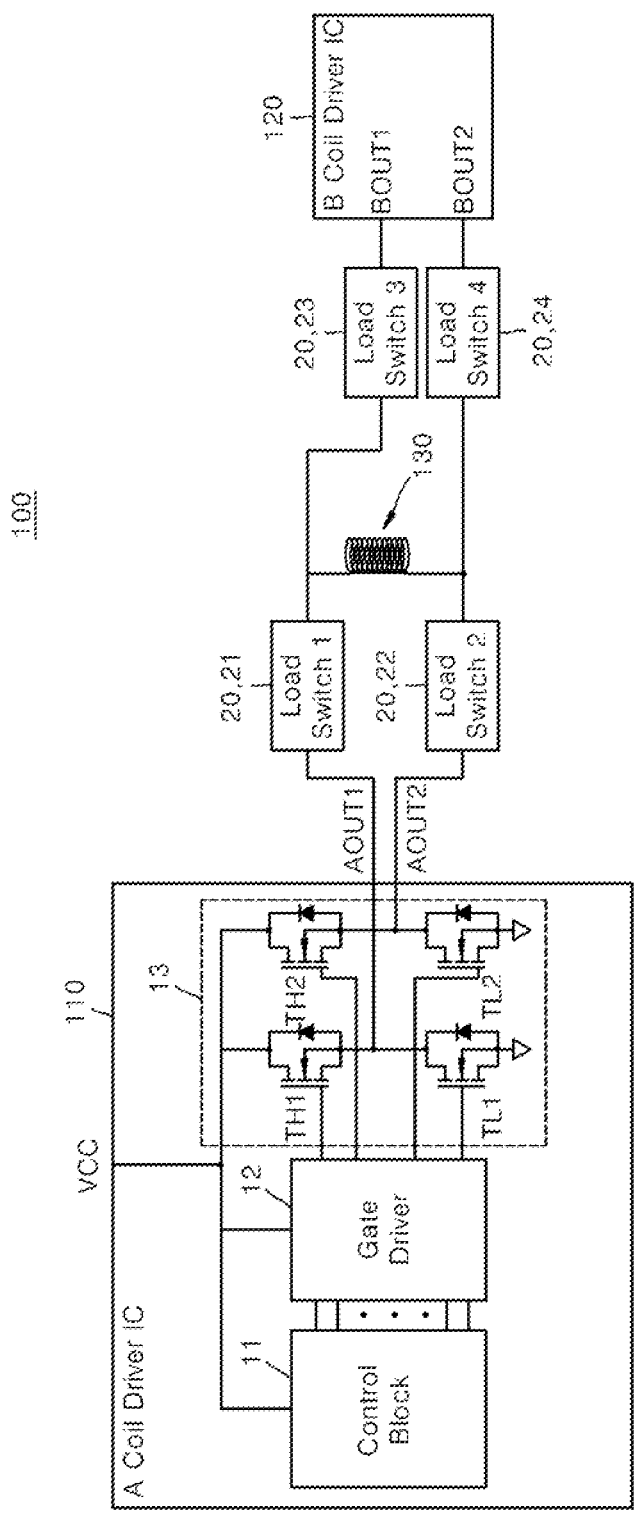
FIG. 1 represents a block diagram for explaining an exemplary coil-sharing electric device according to a prior art.

FIG. 1 represents a block diagram for explaining an exemplary coil-sharing electric device according to a prior art.

As shown in FIG. 1, an exemplary coil-sharing electric device 100 according to a prior art may comprise a first coil-driving IC 110, a second coil-driving IC 120, a coil 130, and a load switch 20.

The first coil-driving IC 110 and the second coil-driving IC 120 may be a driver IC for controlling functions necessary for wireless transmission of data and/or electric power by using the coil 130.

For example, the first coil-driving IC 110 may be a driver used for conducting a function of MST (Magnetic Stripe Transmission) using the coil 130. And for example, the second coil-driving IC 120 may be a driver used for conducting a function of NFC (Near Field Communication) using the coil 130.

And the coil 130 may be connected commonly to the output terminals AOUT1 and AOUT2 of the first coil-driving IC 110 and the output terminals BOUT1 and BOUT2 of the second coil-driving IC 120 via load switches 20.

Each of the load switches 21 and 22 may be connected in series between the coil 130 and the output terminal AOUT1 of the first coil-driving IC 110 and between the coil 130 and the output terminal AOUT2 of the first coil-driving IC 110. And each of the load switches 23 and 24 may be connected in series between the coil 130 and the output terminal BOUT1 of the second coil-driving IC 120 and between the coil 130 and the output terminal BOUT2 of the second coil-driving IC 120.

The first coil-driving IC 110 may comprise a control block 11, a gate driver 12, and a current driving part 13. The current driving part 13, for example, may comprise four transistors. The current driving part 13 may have a first current terminal 301 and a second current terminal 302 (refer to FIG. 3 or FIG. 4). The current output from the first current terminal 301 and the second current terminal 302 may flow into the second current terminal 302 and the first current terminal 301 through the coil 130.

According to the above described configuration, the first coil-driving IC 110 and the second coil-driving IC 120 may share a single coil 130, and perform its own function respectively. Further, the connection among the first coil-driving IC 110 and the second coil-driving IC 120 and the coil 130 can be controlled by controlling ON/OFF of the load switches 20. That is, a current path between the first coil-driving IC 110 and the coil 130 or a current path between the second coil-driving IC 120 and the coil 130 can be broken or revived.

For example, if it is determined that the first coil-driving IC 110 exclusively controls the operation of the coil 130, this can be done by turning off the load switches 23 and 24. With this, a current flow between the second coil-driving IC 120 and the coil 130 is blocked and in result the first coil-driving IC 110 can be operated without any feature degradation.

And, if it is determined that the second coil-driving IC 120 exclusively controls the operation of the coil 130, this can be done by turning off the load switches 21 and 22. With this, a current flow between the first coil-driving IC 110 and the coil 130 is blocked and in result the second coil-driving IC 120 can be operated without any feature degradation.

However, according to the prior are explained with FIG. 1, there is a disadvantage that the price of the load switches 20 is very high.

Figure 2:
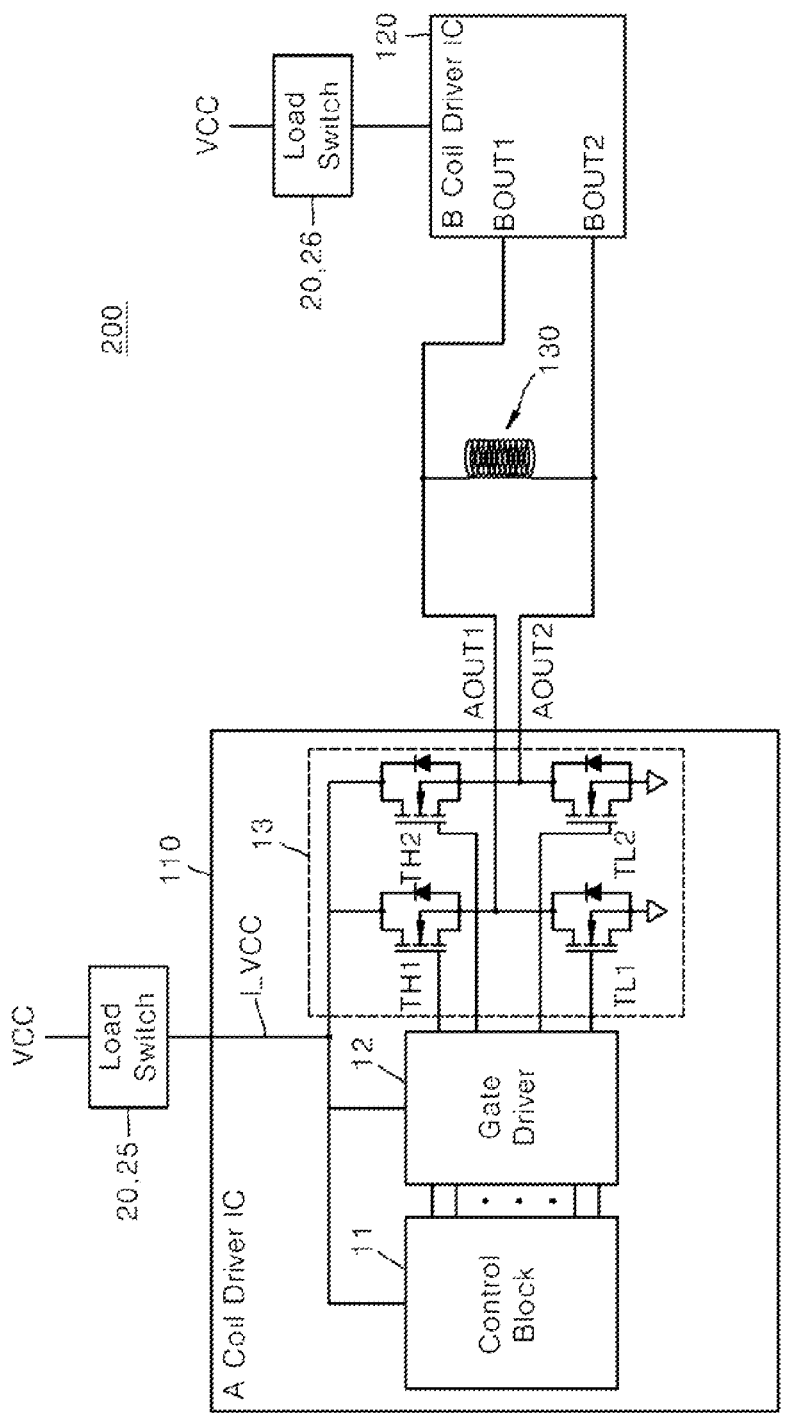
FIG. 2 represents a block diagram to explain other example of coil-sharing electric device according to other prior art.

FIG. 2 represents a block diagram to explain other example of coil-sharing electric device according to other prior art.

In the coil-sharing electric device 200 according to FIG. 2, a load switch 25 may be connected at the power source of the first coil-driving IC 110 and a load switch 26 may be connected at the power source of the second coil-driving IC 120, in order to solve the problem caused by the coil-sharing electric device 100 of FIG. 1.

When the load switch 25 is in its OFF-state, the first coil-driving IC 110 connected to the load switch 25 does not operate, and when the load switch 26 is in its OFF-state, the second coil-driving IC 120 connected to the load switch 26 does not operate. That means that, if it is required for the first coil-driving IC 110 to exclusively have a control over the operation of the coil 130, this can be done by changing the state of the load switch 26 into an OFF state. Otherwise, if it is required for the second coil-driving IC 120 to exclusively have a control over the operation of the coil 130, this can be done by changing the state of the load switch 25 into an OFF state.

However, for example, an unexpected problem can occur if the load switch 25 connected at the power source of the first coil-driving IC 110 is turned into its OFF-state in order for the second coil-driving IC 120 to take an exclusive control over the coil 130. That is, the voltages of the output terminals BOUT1 and BOUT2 of the second coil-driving IC 120 are directly applied to the output terminals of AOUT1 and AOUT2 of the first coil-driving IC 110, and the first coil-driving IC 110 may show an abnormal reaction because of the voltages applied to the output terminals of AOUT1 and AOUT2 of the first coil-driving IC 110. On the contrary to this, the same problem can occur when it is determined that the first coil-driving IC 110 takes an exclusive control over the coil 130.

In the embodiments according to the present invention described later, examples of the coil-sharing electric device which can solve the problem according to the prior arts explained with FIG. 1 and FIG. 2.

Figure 3:
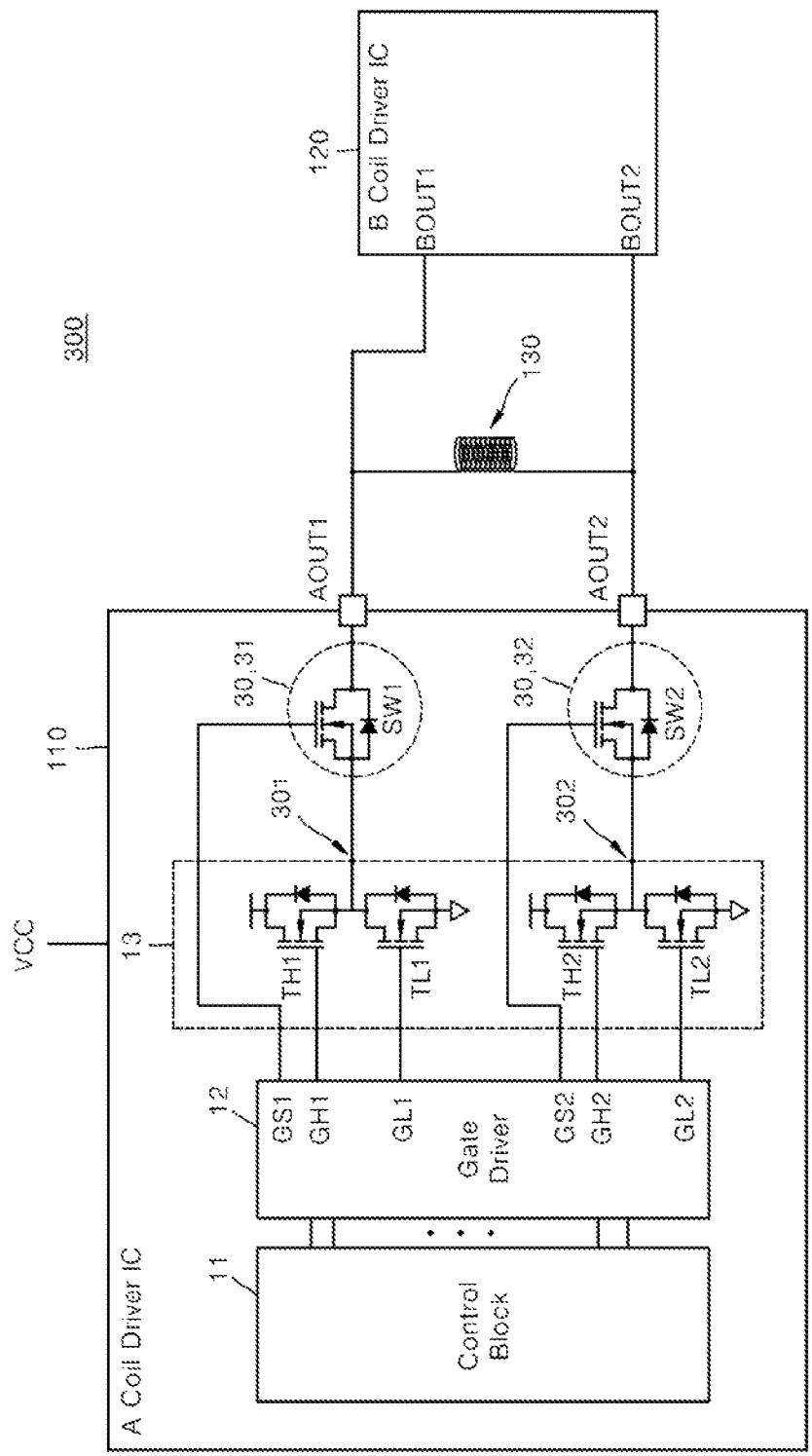
FIG. 3 represents a block diagram showing a coil-sharing electric device according to an embodiment of the present invention.

FIG. 3 represents a block diagram showing a coil-sharing electric device according to an embodiment of the present invention.

Explaining the coil-sharing electric device 300 of one embodiment of the present invention described in FIG. 3. comparing with the coil-sharing electric devices 100 and 200 according to the prior arts, the coil-sharing electric device 100 or 200 according to the prior arts comprises a configuration in that a plurality of load switches 20 are connected to the outside of the coil-driving ICs 110 or 120, whereas the coil-sharing electric device 300 according to an embodiment of the present invention may have a configuration in that a pair of switches 30 are provided inside the first coil-driving IC 110.

Further the current driving part 13 may comprise four transistors. The current driving part 13 may comprise a first current terminal 301 and a second current terminal 302. The current output from the first current terminal 301 or the second current terminal 302 may flow into the second current terminal 302 or the first current terminal 301. The first current terminal 301 may be a source terminal of the first upper transistor TH1 and the second current terminal 302 may be a source terminal of the second upper transistor TH2.

The source of the first upper transistor TH1 may be connected to the drain of the first lower transistor TL1. The source of the first upper transistor may be connected to the source of the first switch SW1 31. And the drain of the first switch 31 may be connected to the first output terminal AOUT1.

The source of the second upper transistor TH2 may be connected to the drain of the second lower transistor TL2. The source of the second upper transistor may be connected to the source of the second switch SW2 32. And the drain of the second switch 32 may be connected to the second output terminal AOUT2.

The gates of the plurality of transistors TH1, TL1, TH2, and TL2 and the gates of a pair of switches 31 and 32 may be controlled by gate control signals output from output terminals GS1, GH1, GL1, GS2, GH2, and GL2 of a gate driving part 12.

When the first switch 31 and the second switch 32 are turned on by signals output from the output terminal GS1 and the output terminal GS2 of the gate driving part 12, a current path may be formed from the first output terminal AOUT1 of the first coil-driving IC 110 to the second output terminal AOUT2 of the first coil-driving IC 110 through the coil 130.

Meanwhile, when the first switch 31 and the second switch 32 are in its OFF-state, by the voltage output from the output terminal BOUT1 and BOUT2 of the second coil-driving IC 120, it is required that no current flows from the first output terminal AOUT1 via the first switch 31 to the source of the first upper transistor TH1. For this, a DMOS parasitic diode D1 can be used which is formed between the source and the drain of the first switch 31. The anode and cathode of the parasitic diode D1 may be connected to the source and the drain of the first switch 31, respectively.

Likewise, when the first switch 31 and the second switch 32 are in its OFF-state, by the voltage output from the output terminal BOUT1 and BOUT2 of the second coil-driving IC 120, it is required that no current flows from the second output terminal AOUT2 via the second switch 32 to the source of the second upper transistor TH2. For this, a DMOS parasitic diode D2 can be used which is formed between the source and the drain of the second switch 32. The anode and cathode of the parasitic diode D2 may be connected to the source and the drain of the second switch 32, respectively.

When the first switch 31 and the second switch 32 are in its OFF-state due to signals output from the output terminal GS1 and the output terminal GS2 of the gate driving part 12, the states of the first output terminal AOUT1 and the second output terminal AOUT2 of the first coil-driving IC 110 turn into a floating state apart from the other internal parts of the first coil-driving IC 110. Because the cathode of the parasitic diode D1 formed between the source and drain of the first switch 31 is connected to the first output terminal AOUT1, no current flows into from the first output terminal AOUT1 through the parasitic diode D1. Likewise, because the cathode of the parasitic diode D2 formed between the source and drain of the second switch 32 is connected to the second output terminal AOUT2, no current flows into from the second output terminal AOUT2 through the parasitic diode D2.

When the first coil-driving IC 110 shares the coil 130 with the second coil-driving IC 120, the parasitic diode D1 and D2 formed at the first switch 31 and the second switch 32 included in the first coil-driving IC 110 break a current path directed into the internal parts of the first coil-driving IC 110 and a current path directed into the driving power source VCC connected to the first coil-driving IC 110 irrespective of the voltage levels of the output terminal BOUT1 and BOUT2 of the second coil-driving IC 120.

Thanks to the above mentioned configuration, when the second coil-driving IC 120 has an exclusive control over the coil 130, it can be achieved that the first coil-driving IC 110 does not operate in an unexpected manner which can be caused by a voltage between one and the other terminal of the coil 130 otherwise. A separate control part unshown in the drawing can determine which one of the first coil-driving IC 110 and the second coil-driving IC 120 takes the exclusive control over the coil 130.

For a case that the coil-sharing electric device 300 is used for a wireless communication system, it may be necessary to let a large scale current ranging about several amperes flow through the coil 130. At this time, a DMOS (Depletion Metal Oxide Semiconductor) element may be used as a semiconductor device which let a large scale current flow without disturbance. For example, a DMOS can be prepared for use so that the voltage $V_{DS}$ between the drain and the source of the DMOS is a several voltage, a tens of voltage, or a hundreds of voltage. And a control part 11 may be operated with a low voltage.

In FIG. 3, a DMOS device can be used for the transistors TH1, TL1, TH2, and TL2. Although a high voltage is allowed for the $V_{DS}$ when using a DMOS device, it may be difficult to control the DMOS device because the voltage allowed for the $V_{GS}$ ranges about 5V. Therefore, in one embodiment of the present invention, an NMOS device can be used instead of a PMOS device for the upper transistors TH1 and TH2 in order to decrease the chip size. Because the current driving capability of an NMOS device is about 2.5 times higher than that of a PMOS device, the chip size can be reduces 2.5 times smaller if an NMOS device is used for the upper transistors TH1 and TH2, compared to using a PMOS device for the upper transistors TH1 and TH2.

One or more load switches 20, which are as shown in FIG. 1 and FIG. 2, may be connected to outside of the second coil-driving IC 120 of FIG. 3. Or, the second coil-driving IC 120 of FIG. 3 may contain a switch inside itself, which is of the same type as the switch 30 shown in the first coil-driving IC 110 show in FIG. 3.

Figure 4:
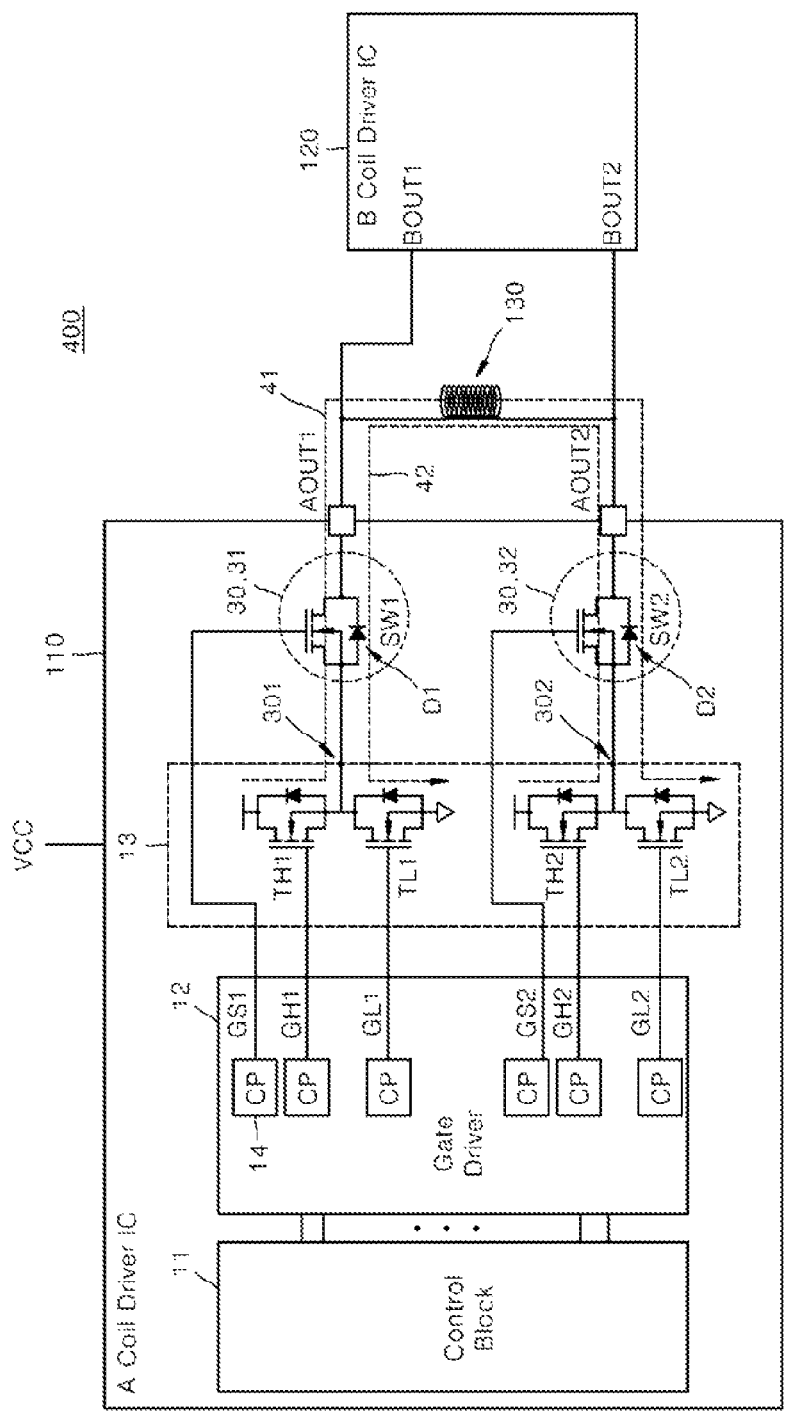
FIG. 4 represents a block diagram showing a coil-sharing electric device according to other embodiment of the present invention.

From now, referring to FIG. 4 and FIG. 5, a coil-sharing electric device 400 is explained according to other embodiment of the present invention.

FIG. 4 represents a block diagram showing a coil-sharing electric device 400 according to other embodiment of the present invention.

FIG. 5 represents a table indicating the voltage levels of the output terminals of the gate driving part 12 and ON/OFF state of the transistors of the first coil-driving IC 110, for the coil-sharing electric device 400 according to the other embodiment of the present invention shown in FIG. 4. The table of (a) of FIG. 5 indicates a case when a first current I1 flows through a first current path 41, and the table of (b) of FIG. 5 indicates other case when a second current I2 flows through a second current path 42.

Comparing the coil-sharing electric device 400 of FIG. 4 with the coil-sharing electric device 300 of FIG. 3, the gate driving part 12 of the coil-sharing electric device 400 shown in FIG. 4 may further comprise charge pumps 14 in addition to the gate driving part 120 shown in FIG. 3. With this, the signals output from the output terminals GH1, GL1, GH2, GL2, GS1, and GS2 of the gate driving part 12 can be generated using the charge pumps 14.

For example, as shown in FIG. 4 and (a) of FIG. 5, in order for a first current I1 to flow through a first current path 41, the first switch SW1 should be in an ON state, the first upper transistor TH1 should be in an ON state, the first lower transistor TL1 should be in an OFF state, the second switch SW2 should be in an ON state, the second upper transistor TH2 should be in an OFF state, and the second lower transistor TL2 should be in an ON state. At this time, it is desired that the output terminals GS1 and GH1 have a voltage 2 VCC as twice as the operation input voltage VCC, the output terminals GS2 and GL2 have a voltage as the same as the operation input voltage VCC, and the output terminal GL1 and GH2 have a zero (0) voltage.

On the contrary, as shown in FIG. 4 and (a) of FIG. 5, in order for a second current I2 to flow through a second current path 42, the first switch SW1 should be in an ON state, the first upper transistor TH1 should be in an OFF state, the first lower transistor TL1 should be in an ON state, the second switch SW2 should be in an ON state, the second upper transistor TH2 should be in an ON state, and the second lower transistor TL2 should be in an OFF state. At this time, it is desired that the output terminals GS2 and GH2 have a voltage 2 VCC as twice as the operation input voltage VCC, the output terminals GS1 and GL1 have a voltage as the same as the operation input voltage VCC, and the output terminal GL2 and GH1 have a zero (0) voltage.

At this time, the voltage 2 VCC as twice as the operation input voltage VCC can be produced by using the charge pumps 140 connected to the output terminals GS1 and GH1 or the output terminals GS2 and GH2 respectively.

At this time, zero (0) voltage or VCC voltage is required to control the lower transistor TL1 and TL2, and charge pumps 14 may be required to adjust the timing of a non-overlapped period.

From now, a coil-driving IC 110 according to another embodiment of the present invention referring to FIG. 3 to FIG. 5 is explained.

A coil-driving IC 110 according to another embodiment of the present invention has a first output terminal AOUT1 configured to be connected to a first terminal of a coil 130 and a second output terminal AOUT2 configured to be connected to a second terminal of the coil 130. The coil-driving IC 110 may comprise a first switch 31 connected to the first output terminal AOUT1; a second switch 32 connected to the second output terminal AOUT2; a current driving part 13 comprising a first current terminal 301 connected to the first output terminal AOUT1 through the first switch 31 and a second current terminal 302 connected to the second output terminal AOUT2 through the second switch 32; and a gate driving part 12 controlling the first switch 31 and the second switch 32 so that, when the coil 130 is driven by a current provided from the first current terminal 301 or the second current terminal 302, the first switch 31 and the second switch 32 are in an ON state, otherwise, the first switch 31 and the second switch 32 are in an OFF state.

In a preferred embodiment, the current driving part 13 may comprise a first upper transistor TH1, a first lower transistor TL1, a second upper transistor TH2, and a second lower transistor TL2. At this time, a source of the first upper transistor TH1 is connected to a drain of the first lower transistor TL1, a source of the second upper transistor TH2 is connected to a drain of the second lower transistor TL2. At this time, the first current terminal 301 may be the source of the first upper transistor TH1, and the second current terminal 302 may be the source of the second upper transistor TH2.

In a preferred embodiment, the gate driving part 12 may be configured to control a voltage applied to a gate of the first upper transistor TH1, a voltage applied to a gate of the first lower transistor TL1, a voltage applied to a gate of the second upper transistor TH2, and a voltage applied to a gate of the second lower transistor TL2.

Further, the first switch 31 may comprise a first DMOS, and the second switch 32 may comprise a second DMOS, and the gate driving part 12 may be configured to control a voltage applied to a gate of the first switch 31 and a voltage applied to a gate of the second switch 32.

In a preferred embodiment, when the first switch 31 and the second switch 32 are controlled to be in an ON state, a voltage twice of a operation voltage of the coil-driving IC 110 may be applied to the gate of the first switch 31 and the gate of the first upper transistor TH1, the operation voltage of the coil-driving IC 110 may be applied to the gate of the second switch 32 and the gate of the second lower transistor TL2, and a ground voltage may be applied to the gate of the first lower transistor TL1 and the gate of the second upper transistor TH2. Or, the voltage twice of a operation voltage of the coil-driving IC 110 may be applied to the gate of the second switch 32 and the gate of the second upper transistor TH2, the operation voltage of the coil-driving IC 110 may be applied to the gate of the first switch 31 and the gate of the first lower transistor TL1, and a ground voltage is applied to the gate of the first upper transistor TH1 and the gate of the second lower transistor TL2.

In a preferred embodiment of the present invention, a charge pump 12 comprised in the gate driving part 12 may generate a voltage applied to the gate of the first upper transistor TH1, a voltage applied to the gate of the first lower transistor TL1, a voltage applied to the gate of the second upper transistor TH2, a voltage applied to the gate of the second lower transistor TL2, a voltage applied to the gate of the first switch 31, and a voltage applied to the gate of the second switch 32.

In a preferred embodiment, the first switch 31 may comprise a first DMOS, and the second switch 32 may comprise a second DMOS, and a source of the first switch 31 may be connected to the first current terminal 301 and a drain of the first switch 31 may be connected to the first output terminal AOUT1. At this time, a source of the second switch 32 may be connected to the second current terminal 302 and a drain of the second switch 32 is connected to the second output terminal AOUT2. At this time, a first diode may be provided between the source and the drain of the first switch 31, wherein a cathode of the first diode is connected to the drain of the first switch 31, and a second diode is provided between the source and the drain of the second switch 32, wherein a cathode of the second diode is connected to the drain of the second switch 32.

In a preferred embodiment, the first upper transistor TH1 may be an NMOS device and the second upper transistor TH2 may be an NMOS device.

In a preferred embodiment, when a current flows from a first terminal of the coil to a second terminal of the coil 130, a gate voltage of the first switch 31 may be higher than both a gate voltage the second switch 32 and a gate voltage of the second lower transistor TL2, and a gate voltage of the first upper transistor TH1 may be higher than both a gate voltage of the second switch 32 and a gate voltage of the second lower transistor TL2. And a gate voltage of the second switch 32 may be higher than both a gate voltage the first lower transistor TL1 and a gate voltage of the second upper transistor TH2, and a gate voltage of the second lower transistor TL2 may be higher than both a gate voltage of the first lower transistor TL1 and a gate voltage of the second upper transistor TH2.

On the other hand, when a current flows from a second terminal of the coil 130 to a first terminal of the coil 130, a gate voltage of the second switch 32 may be higher than both a gate voltage the first switch 31 and a gate voltage of the first lower transistor TL1, and a gate voltage of the second upper transistor TH2 may be higher than both a gate voltage of the first switch 31 and a gate voltage of the first lower transistor TL1. And a gate voltage of the first switch 31 may be higher than both a gate voltage the first upper transistor TH1 and a gate voltage of the second lower transistor TL2, and a gate voltage of the first lower transistor TL1 may be higher than both a gate voltage of the first upper transistor TH1 and a gate voltage of the second lower transistor TL2.

From now, a coil-sharing electric device according to another embodiment of the present invention is explained referring to FIG. 3 to FIG. 5.

A coil-sharing electric device according to another embodiment of the present invention may comprise a coil 130; a first coil-driving IC 110 having a first output terminal AOUT1 connected to a first terminal of the coil 130 and a second output terminal AOUT2 connected to a second terminal of the coil 130; and a second coil-driving IC 120 connected to both the first terminal of the coil 130 and the second terminal of the coil 130.

At this time, the first coil-driving IC may comprise a first switch 31 connected to the first output terminal AOUT1; a second switch 32 connected to the second output terminal AOUT2; a current driving part 130 comprising a first current terminal 301 connected to the first output terminal AOUT1 via the first switch 31 and a second current terminal 302 connected to the second output terminal AOUT2 via the second switch 32; and a gate driving part 12 controlling the first switch 31 and the second switch 32 so that, when the coil 130 is driven by a current provided from the first current terminal 301 or the second current terminal 302, the first switch 31 and the second switch 32 are in an ON state, otherwise, the first switch 31 and the second switch 32 are in an OFF state.

In a preferred embodiment, the current driving part 13 may comprise a first upper transistor TH1, a first lower transistor TL1, a second upper transistor TH2, and a second lower transistor TL2. At this time, a source of the first upper transistor TH1 is connected to a drain of the first lower transistor TL1, a source of the second upper transistor TH2 is connected to a drain of the second lower transistor TL2. At this time, the first current terminal 301 may be the source of the first upper transistor TH1, and the second current terminal 302 may be the source of the second upper transistor TH2.

In a preferred embodiment, the gate driving part 12 may be configured to control a voltage applied to a gate of the first upper transistor TH1, a voltage applied to a gate of the first lower transistor TL1, a voltage applied to a gate of the second upper transistor TH2, and a voltage applied to a gate of the second lower transistor TL2.

Further, the first switch 31 may comprise a first DMOS, and the second switch 32 may comprise a second DMOS, and the gate driving part 12 may be configured to control a voltage applied to a gate of the first switch 31 and a voltage applied to a gate of the second switch 32.

In a preferred embodiment, when the first switch 31 and the second switch 32 are controlled to be in an ON state, a voltage twice of a operation voltage of the coil-driving IC 110 may be applied to the gate of the first switch 31 and the gate of the first upper transistor TH1, the operation voltage of the coil-driving IC 110 may be applied to the gate of the second switch 32 and the gate of the second lower transistor TL2, and a ground voltage may be applied to the gate of the first lower transistor TL1 and the gate of the second upper transistor TH2. Or, the voltage twice of a operation voltage of the coil-driving IC 110 may be applied to the gate of the second switch 32 and the gate of the second upper transistor TH2, the operation voltage of the coil-driving IC 110 may be applied to the gate of the first switch 31 and the gate of the first lower transistor TL1, and a ground voltage is applied to the gate of the first upper transistor TH1 and the gate of the second lower transistor TL2.

In a preferred embodiment of the present invention, a charge pump 12 comprised in the gate driving part 12 may generate a voltage applied to the gate of the first upper transistor TH1, a voltage applied to the gate of the first lower transistor TL1, a voltage applied to the gate of the second upper transistor TH2, a voltage applied to the gate of the second lower transistor TL2, a voltage applied to the gate of the first switch 31, and a voltage applied to the gate of the second switch 32.

In a preferred embodiment, the first switch 31 may comprise a first DMOS, and the second switch 32 may comprise a second DMOS, and a source of the first switch 31 may be connected to the first current terminal 301 and a drain of the first switch 31 may be connected to the first output terminal AOUT1. At this time, a source of the second switch 32 may be connected to the second current terminal 302 and a drain of the second switch 32 is connected to the second output terminal AOUT2. At this time, a first diode may be provided between the source and the drain of the first switch 31, wherein a cathode of the first diode is connected to the drain of the first switch 31, and a second diode is provided between the source and the drain of the second switch 32, wherein a cathode of the second diode is connected to the drain of the second switch 32.

In a preferred embodiment, the first upper transistor TH1 may be an NMOS device and the second upper transistor TH2 may be an NMOS device.

In a preferred embodiment, when a current flows from a first terminal of the coil to a second terminal of the coil 130, a gate voltage of the first switch 31 may be higher than both a gate voltage the second switch 32 and a gate voltage of the second lower transistor TL2, and a gate voltage of the first upper transistor TH1 may be higher than both a gate voltage of the second switch 32 and a gate voltage of the second lower transistor TL2. And a gate voltage of the second switch 32 may be higher than both a gate voltage the first lower transistor TL1 and a gate voltage of the second upper transistor TH2, and a gate voltage of the second lower transistor TL2 may be higher than both a gate voltage of the first lower transistor TL1 and a gate voltage of the second upper transistor TH2.

On the other hand, when a current flows from a second terminal of the coil 130 to a first terminal of the coil 130, a gate voltage of the second switch 32 may be higher than both a gate voltage the first switch 31 and a gate voltage of the first lower transistor TL1, and a gate voltage of the second upper transistor TH2 may be higher than both a gate voltage of the first switch 31 and a gate voltage of the first lower transistor TL1. And a gate voltage of the first switch 31 may be higher than both a gate voltage the first upper transistor TH1 and a gate voltage of the second lower transistor TL2, and a gate voltage of the first lower transistor TL1 may be higher than both a gate voltage of the first upper transistor TH1 and a gate voltage of the second lower transistor TL2.

A person skilled in the art to which the present disclosure pertains may easily implement various variations and modifications without departing from the essential characteristic of the present disclosure, by using the above-described embodiments of the present disclosure. The details of each claim in the following claims may be combined with other claims not dependent thereon as long as it is possible to understand through the specification.

What is claimed is:

1. A coil-driving IC having a first output terminal configured to be connected to a first terminal of a coil and a second output terminal configured to be connected to a second terminal of the coil, comprising:
   a first switch connected to the first output terminal;
   a second switch connected to the second output terminal;
   a current driving part comprising a first current terminal connected to the first output terminal via the first switch and a second current terminal connected to the second output terminal via the second switch; and
   a gate driving part controlling the first switch and the second switch so that, when the coil is driven by a current provided from the first current terminal or the second current terminal, the first switch and the second switch are in an ON state, otherwise, the first switch and the second switch are in an OFF state.

2. The coil-driving IC of claim 1, wherein,
   the current driving part comprises a first upper transistor, a first lower transistor, a second upper transistor, and a second lower transistor,
   a source of the first upper transistor is connected to a drain of the first lower transistor,
   a source of the second upper transistor is connected to a drain of the second lower transistor,
   the first current terminal is the source of the first upper transistor, and
   the second current terminal is the source of the second upper transistor.

3. The coil-driving IC of claim 2, wherein,
   the gate driving part is configured to control a voltage applied to a gate of the first upper transistor, a voltage applied to a gate of the first lower transistor, a voltage applied to a gate of the second upper transistor, and a voltage applied to a gate of the second lower transistor,
   the first switch comprises a first DMOS, and the second switch comprises a second DMOS, and the gate driving part is configured to control a voltage applied to a gate of the first switch and a voltage applied to a gate of the second switch.

4. The coil-driving IC of claim 3, wherein,
when the first switch and the second switch are controlled to be in ON state,
a voltage twice an operation voltage of the coil-driving IC is applied to the gate of the first switch and the gate of the first upper transistor, the operation voltage of the coil-driving IC is applied to the gate of the second switch and the gate of the second lower transistor, and a ground voltage is applied to the gate of the first lower transistor and the gate of the second upper transistor,
or
the voltage twice an operation voltage of the coil-driving IC is applied to the gate of the second switch and the gate of the second upper transistor, the operation voltage of the coil-driving IC is applied to the gate of the first switch and the gate of the first lower transistor, and a ground voltage is applied to the gate of the first upper transistor and the gate of the second lower transistor.

5. The coil-driving IC of claim 3, wherein,
a charge pump comprised in the gate driving part generates a voltage applied to the gate of the first upper transistor, a voltage applied to the gate of the first lower transistor, a voltage applied to the gate of the second upper transistor, a voltage applied to the gate of the second lower transistor, a voltage applied to the gate of the first switch, and a voltage applied to the gate of the second switch.

6. The coil-driving IC of claim 2, wherein, the first upper transistor is an NMOS device and the second upper transistor is an NMOS device.

7. The coil-driving IC of claim 2, wherein,
when a current flows from the first terminal of the coil to the second terminal of the coil,
a gate voltage of the first switch is higher than both a gate voltage of the second switch and a gate voltage of the second lower transistor, and a gate voltage of the first upper transistor is higher than both a gate voltage of the second switch and a gate voltage of the second lower transistor, and
a gate voltage of the second switch is higher than both a gate voltage of the first lower transistor and a gate voltage of the second upper transistor, and a gate voltage of the second lower transistor is higher than both a gate voltage of the first lower transistor and a gate voltage of the second upper transistor.

8. The coil-driving IC of claim 2, wherein,
when a current flows from the second terminal of the coil to the first terminal of the coil,
a gate voltage of the second switch is higher than both a gate voltage of the first switch and a gate voltage of the first lower transistor, and a gate voltage of the second upper transistor is higher than both a gate voltage of the first switch and a gate voltage of the first lower transistor, and
a gate voltage of the first switch is higher than both a gate voltage of the first upper transistor and a gate voltage of the second lower transistor, and a gate voltage of the first lower transistor is higher than both a gate voltage of the first upper transistor and a gate voltage of the second lower transistor.

9. The coil-driving IC of claim 1, wherein,
the first switch comprises a first DMOS, and the second switch comprises a second DMOS, and a source of the first switch is connected to the first current terminal and a drain of the first switch is connected to the first output terminal,
a source of the second switch is connected to the second current terminal and a drain of the second switch is connected to the second output terminal,
a first diode is provided between the source and the drain of the first switch, wherein a cathode of the first diode is connected to the drain of the first switch, and
a second diode is provided between the source and the drain of the second switch, wherein a cathode of the second diode is connected to the drain of the second switch.

10. A coil-sharing electric device comprising:
a coil;
a first coil-driving IC having a first output terminal connected to a first terminal of the coil and a second output terminal connected to a second terminal of the coil; and
a second coil-driving IC connected to both the first terminal of the coil and the second terminal of the coil,
wherein,
the first coil-driving IC comprises:
a first switch connected to the first output terminal,
a second switch connected to the second output terminal,
a current driving part comprising a first current terminal connected to the first output terminal via the first switch and a second current terminal connected to the second output terminal via the second switch, and
a gate driving part controlling the first switch and the second switch so that, when the coil is driven by a current provided from the first current terminal or the second current terminal, the first switch and the second switch are in an ON state, otherwise, the first switch and the second switch are in an OFF state.

* * * * *